United States Patent
Jeong

(10) Patent No.: US 9,530,937 B2
(45) Date of Patent: Dec. 27, 2016

(54) LIGHT-EMITTING DEVICE, LIGHT-EMITTING DEVICE PACKAGE, AND LIGHT UNIT

(71) Applicant: LG INNOTEK CO., LTD., Seoul (KR)

(72) Inventor: Hwan Hee Jeong, Seoul (KR)

(73) Assignee: LG INNOTEK CO., LTD, Seoul (KR)

( * ) Notice: Subject to any disclaimer, the term of this patent is extended or adjusted under 35 U.S.C. 154(b) by 0 days.

(21) Appl. No.: 14/405,794

(22) PCT Filed: Jun. 4, 2013

(86) PCT No.: PCT/KR2013/004893
§ 371 (c)(1),
(2) Date: Dec. 5, 2014

(87) PCT Pub. No.: WO2013/183901
PCT Pub. Date: Dec. 12, 2013

(65) Prior Publication Data
US 2015/0303352 A1  Oct. 22, 2015

(30) Foreign Application Priority Data
Jun. 8, 2012  (KR) ........................ 10-2012-0061372

(51) Int. Cl.
*H01L 33/40* (2010.01)
*H01L 33/38* (2010.01)
*H01L 33/62* (2010.01)
*H01L 33/00* (2010.01)
*H01L 33/44* (2010.01)
*H01L 33/22* (2010.01)

(52) U.S. Cl.
CPC ........... *H01L 33/405* (2013.01); *H01L 33/385* (2013.01); *H01L 33/62* (2013.01); *H01L 33/0079* (2013.01);
(Continued)

(58) Field of Classification Search
CPC ....... H01L 33/385; H01L 33/405; H01L 33/62
(Continued)

(56) References Cited

U.S. PATENT DOCUMENTS

2007/0176193 A1  8/2007  Nagai
2010/0171135 A1* 7/2010  Engl ..................... H01L 33/382
257/98
(Continued)

FOREIGN PATENT DOCUMENTS

CN          101107324 A     1/2008
DE   WO 2011107344 A1 *  9/2011  ........... H01L 33/382
(Continued)

*Primary Examiner* — Kenneth Parker
*Assistant Examiner* — Warren H Kilpatrick
(74) *Attorney, Agent, or Firm* — Birch, Stewart, Kolasch & Birch, LLP

(57) ABSTRACT

A light-emitting device, according to one embodiment, comprises: a light-emitting structure comprising a first conductive semiconductor layer, an active layer which is underneath the first conductive semiconductor layer, and a second conductive semiconductor layer which is underneath the active layer; a reflective electrode which is arranged under the light-emitting structure; a first metal layer which is arranged under the reflective electrode and is electrically connected to the second conductive semiconductor layer; a second metal layer which is arranged under the reflective electrode and is insulated from the first metal layer; and a contact portion for electrically connecting the second metal layer and the first conductive semiconductor layer.

19 Claims, 9 Drawing Sheets

(52) U.S. Cl.
CPC ............. *H01L 33/22* (2013.01); *H01L 33/44* (2013.01); *H01L 2224/48091* (2013.01); *H01L 2224/48247* (2013.01); *H01L 2924/181* (2013.01); *H01L 2933/0066* (2013.01)

(58) Field of Classification Search
USPC .......................................... 257/98
See application file for complete search history.

(56) References Cited

U.S. PATENT DOCUMENTS

| | | | |
|---|---|---|---|
| 2011/0089450 A1* | 4/2011 | Jeong | ............... H01L 33/145 257/98 |
| 2011/0227109 A1 | 9/2011 | Kim et al. | |
| 2011/0248237 A1 | 10/2011 | Choi et al. | |
| 2011/0297979 A1 | 12/2011 | Diana et al. | |
| 2012/0007121 A1 | 1/2012 | Lee et al. | |
| 2012/0281387 A1* | 11/2012 | Tung | ..................... F21V 31/04 362/84 |
| 2012/0306363 A1 | 12/2012 | Mochizuki et al. | |
| 2013/0146910 A1* | 6/2013 | Maute | ................... H01L 33/382 257/98 |

FOREIGN PATENT DOCUMENTS

| | | |
|---|---|---|
| EP | 2 375 460 A1 | 10/2011 |
| JP | 2006-086469 A | 3/2006 |
| KR | 10-2011-0118756 A | 11/2011 |
| KR | 10-1114191 B1 | 3/2012 |
| KR | 10-1138948 B1 | 4/2012 |

* cited by examiner

LIGHT-EMITTING DEVICE, LIGHT-EMITTING DEVICE PACKAGE, AND LIGHT UNIT

CROSS-REFERENCE TO RELATED APPLICATION

This application claims under 35 U.S.C. §119 to Korean Patent Application No. 10-2012-0061372 filed on Jun. 8, 2012, which is hereby incorporated by reference.

TECHNICAL FIELD

The embodiment relates to a light-emitting device, a light-emitting device package, and a light unit.

BACKGROUND ART

A light-emitting diode (LED) has been extensively used as one of light-emitting devices. The LED converts electrical signals into the form of light such as infra-red light, ultraviolet light, and visible light by using the characteristic of a compound semiconductor.

As the light efficiency of the light-emitting device is increased, the LED has been used in various fields such as display apparatuses and lighting appliances.

DISCLOSURE

Technical Problem

The embodiment provides a light-emitting device, a light-emitting device package, and a light unit, capable of lowering operating voltage and improving light extraction efficiency.

Technical Solution

A light-emitting device according to the embodiment includes a light-emitting structure including a first conductive semiconductor layer, an active layer under the first conductive semiconductor layer, and a second conductive semiconductor layer under the active layer; a reflective electrode under the light-emitting structure; a first metal layer disposed under the reflective electrode and electrically connected to the second conductive semiconductor layer; a second metal layer disposed under the reflective electrode and insulated from the first metal layer; and a contact part electrically connecting the second metal layer to the first conductive semiconductor layer.

A light-emitting device package according to the embodiment includes a body; a light-emitting device on the body; and first and second lead electrodes electrically connected to the light-emitting device, wherein the light-emitting device includes a light-emitting structure including a first conductive semiconductor layer, an active layer under the first conductive semiconductor layer, and a second conductive semiconductor layer under the active layer; a reflective electrode under the light-emitting structure; a first metal layer disposed under the reflective electrode and electrically connected to the second conductive semiconductor layer; a second metal layer disposed under the reflective electrode and insulated from the first metal layer; and a contact part electrically connecting the second metal layer to the first conductive semiconductor layer.

A light unit according to the embodiment includes a substrate; a light-emitting device on the substrate; and an optical member serving as an optical path for light emitted from the light-emitting device, wherein the light-emitting device includes a light-emitting structure including a first conductive semiconductor layer, an active layer under the first conductive semiconductor layer, and a second conductive semiconductor layer under the active layer; a reflective electrode under the light-emitting structure; a first metal layer disposed under the reflective electrode and electrically connected to the second conductive semiconductor layer; a second metal layer disposed under the reflective electrode and insulated from the first metal layer; and a contact part electrically connecting the second metal layer to the first conductive semiconductor layer.

Advantageous Effects

The light-emitting device, the light-emitting device package, and the light unit according to the embodiment can lower operating voltage and improve the light extraction efficiency.

BEST MODE

Mode for Invention

Figure 1:
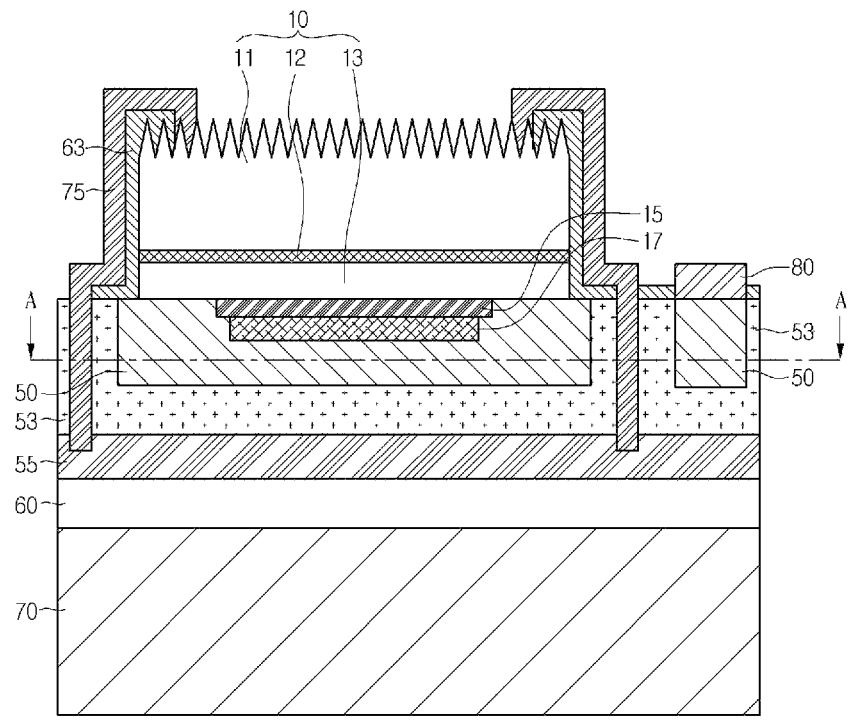
FIG. 1 is a view showing a light-emitting device according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light-emitting device, a light-emitting device package, a light unit, and a method for fabricating the light-emitting device according to the embodiments will be described in detail with reference to accompanying drawings.

FIG. 1 is a view showing a light-emitting device according to the embodiment.

As shown in FIG. 1, the light-emitting device according to the embodiment may include a light-emitting structure 10, a reflective electrode 17, a first metal layer 50, a second metal layer 55 and a contact part 75.

The light-emitting structure 10 may include a first conductive semiconductor layer 11, an active layer 12, and a second conductive semiconductor layer 13. The active layer 12 may be interposed between the first conductive semiconductor layer 11 and the second conductive semiconductor layer 13. The active layer 12 may be provided under the first conductive semiconductor layer 11, and the second conductive semiconductor layer 13 may be provided under the active layer 12.

For instance, the first conductive semiconductor layer 11 may include an N-type semiconductor layer doped with N-type dopants serving as first conductive dopants, and the second conductive semiconductor layer 13 may include a P-type semiconductor layer doped with P-type dopants serving as second conductive dopants. In addition, the first conductive semiconductor layer 11 may include a P-type semiconductor layer, and the second conductive semiconductor layer 13 may include an N-type semiconductor layer.

For example, the first conductive semiconductor layer 11 may include an N-type semiconductor layer. The first conductive semiconductor layer 11 may be realized by using a compound semiconductor. The first conductive semiconductor layer 11 may be realized by using a group II-VI compound semiconductor, or a group III-V compound semiconductor.

For example, the first conductive first semiconductor layer 11 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the first conductive first semiconductor layer 11 may include one selected from the group consisting of GaN, AlN, AlGaN, InGaN, InN, InAlGaN, AlInN, AlGaAs, GaP, GaAs, GaAsP, and AlGaInP doped with N-type dopants such as Si, Ge, Sn, Se, and Te.

The active layer 12 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a compound semiconductor. The active layer 12 may be realized by using a semiconductor material having a compositional formula of $In_xAl_yGa_{1-x-y}N$ ($0 \leq x \leq 1$, $0 \leq y \leq 1$, $0 \leq x+y \leq 1$). When the active layer 12 has an MQW structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may include a P-type semiconductor layer. The second conductive semiconductor layer 13 may be realized by using a compound semiconductor. For example, the second conductive semiconductor layer 13 may be realized by using a group II-VI compound semiconductor, or a group II-V compound semiconductor.

For example, the second conductive semiconductor layer 13 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 13 may include one selected from the group consisting of GaN, AlN, AlGaN, InGaN, InN, InAlGaN, AlInN, AlGaAs, GaP, GaAs, GaAsP, and AlGaInP doped with P-type dopants such as Mg, Zn, Ca, Sr, and Ba.

Meanwhile, the first conductive semiconductor layer 11 may include a P-type semiconductor layer and the second conductive semiconductor layer 13 may include the N-type semiconductor layer. In addition, a semiconductor layer including an N-type or P-type semiconductor layer may be additionally provided under the second conductive semiconductor layer 13. Accordingly, the first light-emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 13 with uniform or non-uniform doping concentration. In other words, the first light-emitting structure 10 may have various structures, and the embodiment is not limited thereto.

In addition, a first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 13.

The reflective electrode 17 may be disposed under the light-emitting structure 10. An ohmic contact layer 15 may be further disposed between the light-emitting structure 10 and the reflective electrode 17. The first metal layer 50 may be disposed under the light-emitting structure 10 and around the ohmic contact layer 15. The first metal layer 50 may be disposed around a lower portion of the light-emitting structure 10. The first metal layer 50 may be disposed around the reflective electrode 17.

The first metal layer 50 may be electrically connected to the second conductive semiconductor layer 13. A first region of the first metal layer 50 may be may make contact with a bottom of the second conductive semiconductor layer 13 and a second region of the first metal layer 50 may extend outward from the first region. The first metal layer 50 may make contact with a bottom of the reflective electrode 17.

For example, the ohmic contact layer 15 may include a transparent conductive oxide layer. For example, the ohmic contact layer 15 may include at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt and Ag.

The reflective electrode 17 may include a material having high reflectance. For example, the reflective electrode 17 may include a metal including at least one of Ag, Ni, Al, Rh, Pd, Ir, Ru, Mg, Zn, Pt, Cu, Au, and Hf, or an alloy thereof. In addition, the reflective electrode 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective electrode 17 may include at least one of Ag, Al, an Ag—Pd—Cu alloy, and an Ag—Cu alloy.

The ohmic contact layer 15 may come into ohmic-contact with the light-emitting structure 10. The reflective electrode 17 may reflect light incident thereto from the light-emitting structure 10 to increase the quantity of light extracted to an outside.

The first metal layer 50 may include at least one of Cu, Ni, Ti, Ti—W, Cr, W, Pt, V, Fe, and Mo. The first metal layer 50 may serve as a diffusion barrier layer.

The light-emitting device according to the embodiment may include the second metal layer 55 disposed under the reflective electrode and electrically insulated from the first metal layer 50. The second metal layer 55 may include at least one of Cu, Ni, Ti, Ti—W, Cr, W, Pt, V, Fe, and Mo. The second metal layer 55 may serve as a diffusion barrier layer.

The second metal layer 55 may be disposed under the first metal layer 50. The light-emitting device according to the embodiment may include a first insulating layer 53 disposed between the first metal layer 50 and the second metal layer 55. The first insulating layer 53 may be disposed around the first metal layer 50. The first insulating layer 53 may include at least one of oxide and nitride. For instance, the first insulating layer 53 may include at least one of $Al_2O_3$, $SiO_2$, $Si_3N_4$, $TiO_2$, and AlN.

In addition, the light-emitting device according to the embodiment may include the contact part 75 which electrically insulates the second metal layer 55 from the first conductive semiconductor layer 11. The contact part 75 may be formed through the first insulating layer 53. A plurality of contact parts 75 may be provided. The contact part 75 may include at least one selected from the group consisting of Cr, V, Pt, W, Ti, Zn, Ni, Cu, Al, Ag, and Au.

A first region of the contact part 75 may make contact with a top surface of the first conductive semiconductor layer 11. A second region of the contact part 75 may be disposed at lateral sides of the active layer 12 and the second conductive semiconductor layer 13. A second insulating layer 63 may be disposed between the second region of the contact part 75 and the active layer 12 and between the second region of the contact part 75 and the second conductive semiconductor layer 13.

The second insulating layer 63 may electrically insulate the contact part 75 from the active layer 12. The second insulating layer 63 may electrically insulate the contact part 75 from the second conductive semiconductor layer 13. One end of the second insulating layer 63 may be disposed on the first conductive semiconductor layer 11. The other end of the second insulating layer 63 may be disposed on the first insulating layer 53. A portion of the second insulating layer 63 may be disposed between the contact part and the first insulating layer 53. The first insulating layer 53 may include at least one of oxide and nitride. For instance, the first insulating layer 53 may include at least one of $Al_2O_3$, $SiO_2$, $Si_3N_4$, $TiO_2$, and AlN.

Figure 2:
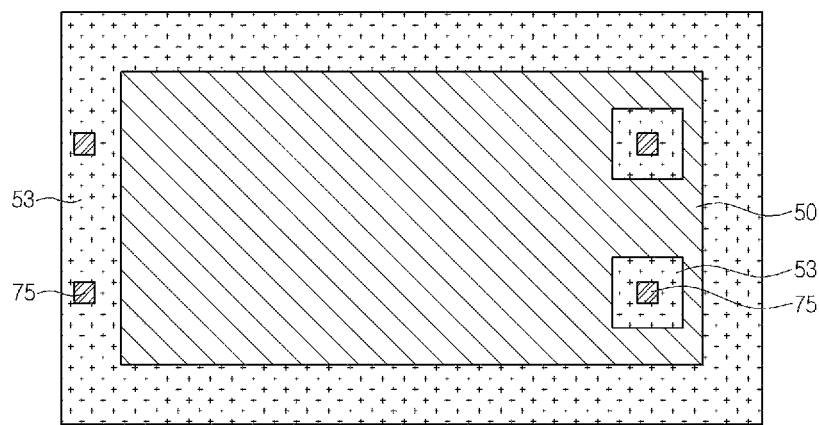
FIG. 2 is a view showing a first metal layer and a contact part of a light-emitting device according to the embodiment.

The contact part 75 may be spaced apart from a lateral side of the first metal layer 50. For instance, the first metal layer 50, the first insulating layer 53 and the contact part 75 may have the structure as shown in FIG. 2. FIG. 2 is a sectional view taken along line A-A of the light-emitting device shown in FIG. 1.

A plurality of contact parts 75 may be provided. The contact part 75 may be surrounded by the first insulating layer 53. The contact part 75 may be electrically insulated from the first metal layer 50 by the first insulating layer 53.

A bonding layer 60 and a support member 70 may be disposed under the second metal layer 55.

The second metal layer 55 may prevent a material included in the bonding layer 60 from being diffused to the reflective electrode 17 in the process of providing the bonding layer 60. The second metal layer 55 may prevent a material, such as Sn, included in the bonding layer 60 from exerting an influence upon the reflective electrode 17.

The bonding layer 60 may include barrier metal or bonding metal. For example, the bonding layer 60 may include at least one of Ti, Au, Sn, Ni, Cr, Ga, In, Bi, Cu, Ag, Nb, Pd and Ta. The support member 70 may support the light-emitting structure 10 according to the embodiment while performing a heat radiation function. The bonding layer 60 may be realized in the form of a seed layer.

The support member 70 may include at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities. For example, the support member 70 may be formed of insulating material.

Meanwhile, the light-emitting device according to the embodiment may include the electrode 80 which is electrically connected to the first metal layer 50 and spaced apart from a lateral side of the light-emitting structure 10. The electrode 80 spaced apart from a lateral side of the light-emitting structure 10 may make contact with a top surface of the first metal layer 50.

According to the embodiment, power may be applied to the light-emitting structure 10 through the reflective electrode 17 and the electrode 80. According to the embodiment, the electrode 80 may be realized in the form of a multiple layer. The electrode 80 may include an ohmic layer, an intermediate layer, and an upper layer. The ohmic layer may include a material selected from the group consisting of Cr, V, Pt, W, Ti, and Zn to realize ohmic contact. The intermediate layer may be realized by using a material selected from the group consisting of Ni, Cu, Al and Ag. For instance, the upper layer may include Au. The electrode 80 may include at least one selected from the group consisting of Cr, V, Pt, W, Ti, Zn, Ni, Cu, Al, Ag, and Au.

A light extraction pattern may be provided on the top surface of the light-emitting structure 10. A concavo-convex pattern may be provided on the top surface of the light-emitting structure 10. For example, the light extraction pattern provided on the light-emitting structure 10 may be formed through a PEC (photo electro chemical) etching process. Therefore, according to the embodiment, the light extraction effect to the outside can be increased.

In the light-emitting device according to the embodiment, a power source having a first electric potential may be connected to the second conductive semiconductor layer 13 through the first metal layer 50 and the reflective electrode 17 and a power source having a second electric potential may be connected to the first conductive semiconductor layer 11 through the second metal layer 55 and the contact part 75. Thus, power may be applied to the light-emitting structure 10 so that the active layer 12 may emit light. According to the light-emitting device of the embodiment, the contact parts 75 may be connected to the first conductive semiconductor layer 11, so that the current spreading can be improved. As a result, the operating voltage can be lowered.

Hereinafter, a method of fabricating the light-emitting device according to the embodiment will be described with reference to FIGS. 3 to 7.

Figure 3:
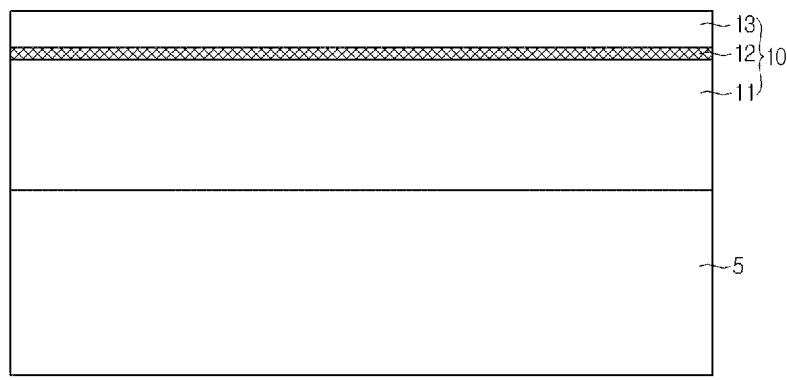
FIGS. 3 to 7 are views showing a method of fabricating a light-emitting device according to the embodiment.

According to the method of fabricating the light-emitting device of the embodiment, as shown in FIG. 3, the first conductive semiconductor layer 11, the active layer 12, and the second conductive semiconductor layer 13 may be formed on a substrate 5. The first conductive semiconductor layer 11, the active layer 12, and the second conductive semiconductor layer 13 may be defined as the light-emitting structure 10

For example, the substrate 5 may include at least one of a sapphire substrate ($Al_2O_3$), SiC, GaAs, GaN, ZnO, Si, GaP, InP, and Ge, but the embodiment is not limited thereto. A buffer layer may be interposed between the first conductive semiconductor layer 11 and the substrate 5.

For example, the first conductive semiconductor layer 11 may include an N-type semiconductor layer doped with N-type dopants serving as first conductive dopants, and the second conductive semiconductor layer 13 may include a P-type semiconductor layer doped with P-type dopants serving as second conductive dopants. In addition, the first conductive semiconductor layer 11 may include a P-type semiconductor layer, and the second conductive semiconductor layer 13 may include an N-type semiconductor layer.

For example, the first conductive semiconductor layer 11 may include an N-type semiconductor. The first conductive semiconductor layer 11 may include a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11a may include one selected from the group consisting of InAlGaN, GaN, AlGaN, AlInN, InGaN, AlN, and InN, and may be doped with N-type dopants such as Si, Ge, Sn, Se, and Te.

The active layer 12 emits light having a wavelength corresponding to the energy band gap difference according to materials constituting the active layer 12 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a semiconductor material having a compositional formula of $In_xAl_yGa_{1-x-y}N$ ($0 \leq x \leq 1$, $0 \leq y \leq 1$, $0 \leq x+y \leq 1$). When the active layer 12 has an MQW structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may be realized by using a P type semiconductor. The second conductive semiconductor layer 13 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 13 may include one selected from the group consisting of InAlGaN, GaN, AlGaN, InGaN, AlInN, AlN, and InN, and may be doped with P-type dopants such as Mg, Zn, Ca, Sr, and Ba.

Meanwhile, the first conductive semiconductor layer 11 may include a P-type semiconductor layer and the second conductive semiconductor layer 13 may include the N-type semiconductor layer. In addition, a semiconductor layer including an N-type or P-type semiconductor layer may be additionally provided on the second conductive semiconductor layer 13. Accordingly, the light-emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 13 with uniform or non-uniform doping concentration. In other words, the light-emitting structure 10 may have various structures, and the embodiment is not limited thereto.

In addition, the first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 12.

Figure 4:
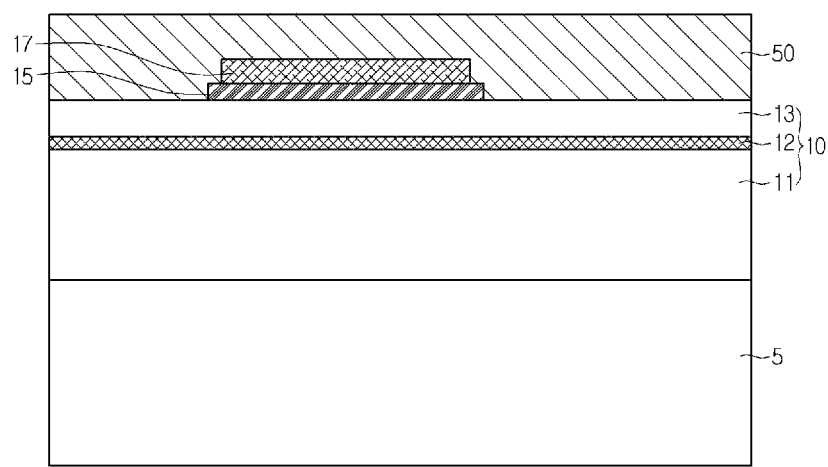

Next, as shown in FIG. 4, the ohmic contact layer 15 and the reflective electrode 17 may be formed on the light-emitting structure 10.

For example, the ohmic contact layer 15 may include a transparent conductive oxide layer. For example, the ohmic contact layer 15 may include at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt and Ag.

The reflective electrode 17 may include a material having high reflectance. For example, the reflective electrode 17 may include a metal including at least one of Ag, Ni, Al, Rh, Pd, Ir, Ru, Mg, Zn, Pt, Cu, Au, and Hf, or an alloy thereof. In addition, the reflective electrode 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective electrode 17 may include at least one of Ag, Al, an Ag—Pd—Cu alloy, and an Ag—Cu alloy.

In addition, as shown in FIG. 4, the first metal layer 50 may be formed on the reflective layer 17. The first metal layer 50 may be formed around the ohmic contact layer 15 and on the reflective layer 17. The first metal layer 50 may include at least one of Cu, Ni, Ti, Ti—W, Cr, W, Pt, V, Fe, and Mo. The first metal layer 50 may serve as a diffusion barrier layer.

Figure 5:
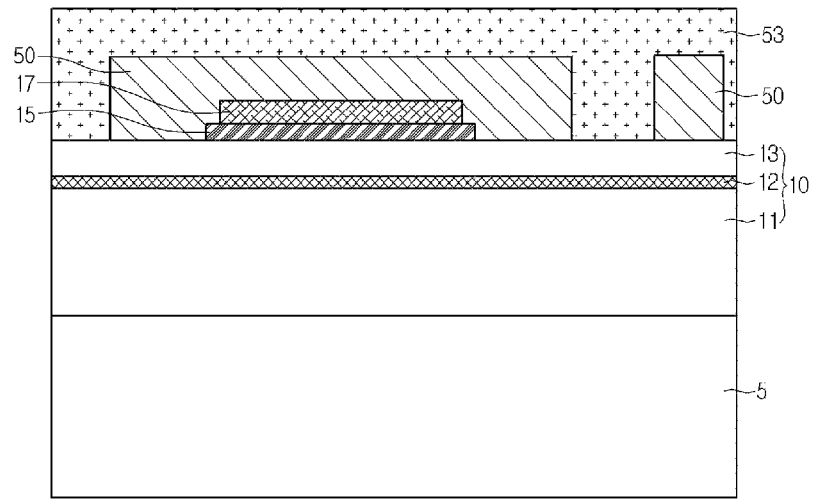

Then, as shown in FIG. 5, the first insulating layer 53 may be formed on the first metal layer 50. The first insulating layer 53 may be defined within the first metal layer 50. The first insulating layer 53 may include at least one of oxide and nitride. For instance, the first insulating layer 53 may include at least one of $Al_2O_3$, $SiO_2$, $Si_3N_4$, $TiO_2$, and AlN.

Meanwhile, above processes for forming layers are illustrative purpose only and the process sequence may be variously changed.

Figure 6:
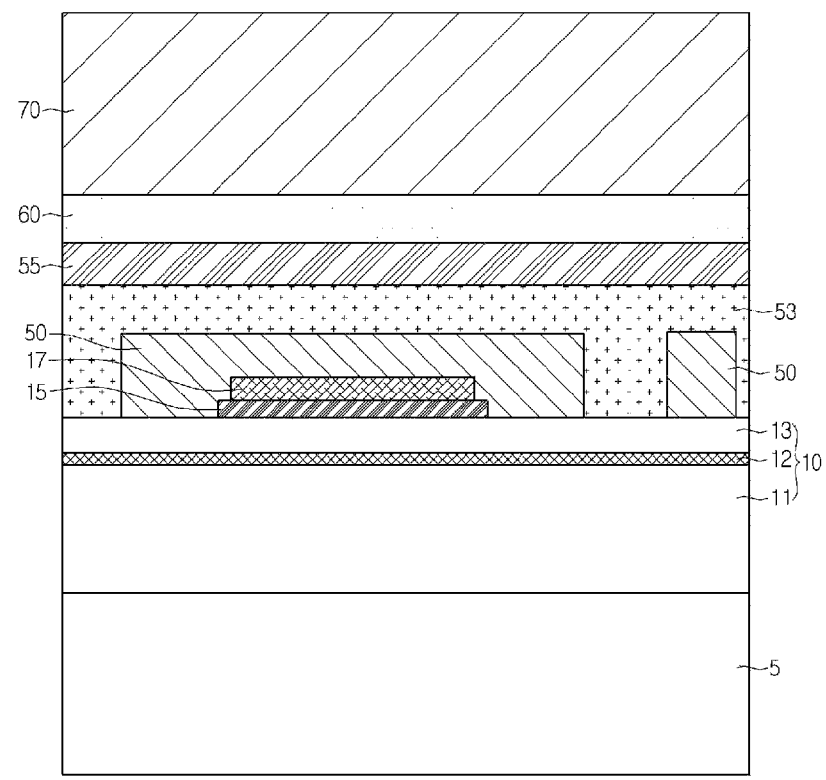

In addition, as shown in FIG. 6, the second metal layer 55, the bonding layer 60 and the support member 70 may be provided on the first insulating layer 53. The second metal layer 55 may prevent a material included in the bonding layer 60 from being diffused to the reflective electrode 17 in the process of providing the bonding layer 60. The second metal layer 55 may prevent a material, such as Sn, included in the bonding layer 60 from exerting an influence upon the reflective electrode 17.

The bonding layer 60 may include barrier metal or bonding metal. For example, the bonding layer 60 may include at least one of Ti, Au, Sn, Ni, Cr, Ga, In, Bi, Cu, Ag, Nb, Pd and Ta. The support member 70 may support the light-emitting structure 10 according to the embodiment while performing a heat radiation function. The bonding layer 60 may be realized in the form of a seed layer.

The support member 70 may include at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities. The support member 70 may be formed of an insulating material.

Next, the substrate 5 is removed from the first conductive semiconductor layer 11. According to one example, the substrate 5 may be removed through a laser lift off (LLO) process. The LLO process is a process to delaminate the substrate 5 from the first conductive semiconductor layer 11 by irradiating a laser to the bottom surface of the substrate 5.

Figure 7:
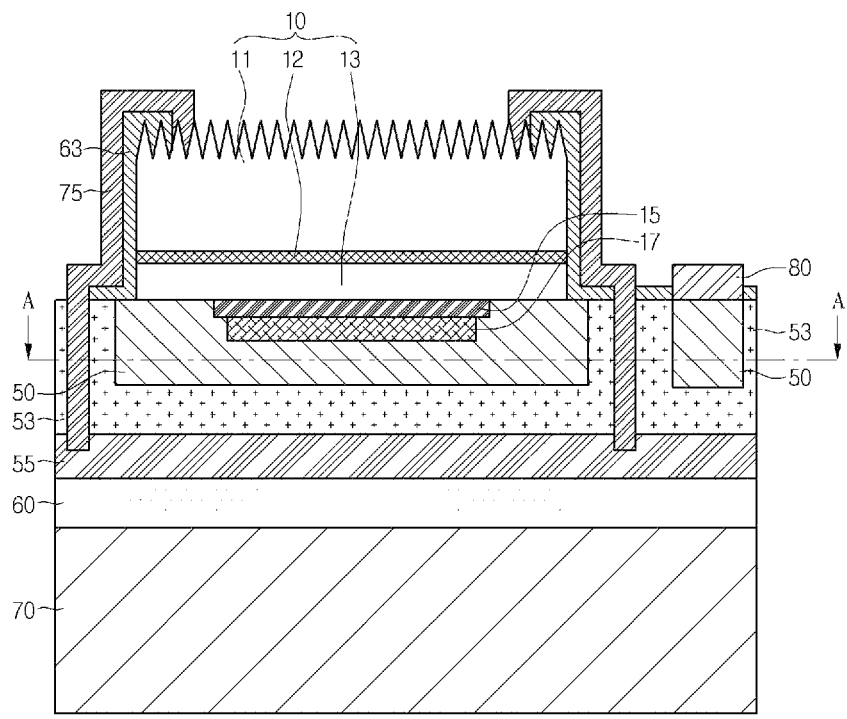

Then, as shown in FIG. 7, the lateral side of the light-emitting structure 10 is etched through an isolation etching process to expose a portion of the second metal layer 55 and a portion of the first insulating layer 53. The isolation etching process may be performed through a dry etching process such as an inductively coupled plasma (ICP) process, but the embodiment is not limited thereto.

A first region of the first metal layer 50 may be disposed under the light-emitting structure 10. A second region of the first metal layer 50 may extend outward from the first region. The second region of the first metal layer 50 may horizontally extend from the first region. The second region of the first metal layer 50 may be exposed to a lower outer peripheral portion of the light-emitting structure 10.

A light extraction pattern may be provided on the top surface of the light-emitting structure 10. A concavo-convex pattern may be provided on the top surface of the light-emitting structure 10. For example, the light extraction pattern may be formed through a PEC (photo electro chemical) etching process. Therefore, according to the embodiment, the light extraction effect to the outside can be increased. According to the embodiment, the top surface of the light-emitting structure 10 may serve as an N plane, which has a higher roughness than a Ga plane, so the light extraction efficiency may be further improved.

Next, as shown in FIG. 7, the second insulating layer 63 may be formed on a top surface and a lateral side of the light-emitting structure 10. For instance, the second insulating layer 63 may include at least one selected from the group consisting of $Al_2O_3$, $SiO_2$, $Si_3N_4$, $TiO_2$, and AlN. Then, the contact part 75 and the electrode 80 may be formed on the second insulating layer 63.

The light-emitting device according to the embodiment may include the second metal layer 55 disposed under the reflective electrode and electrically insulated from the first metal layer 50. The second metal layer 55 may include at least one of Cu, Ni, Ti, Ti—W, Cr, W, Pt, V, Fe, and Mo. The second metal layer 55 may serve as a diffusion barrier layer.

The second metal layer 55 may be disposed under the first metal layer 50. The light-emitting device according to the embodiment may include a first insulating layer 53 disposed between the first metal layer 50 and the second metal layer 55. The first insulating layer 53 may be disposed around the first metal layer 50.

In addition, the light-emitting device according to the embodiment may include the contact part 75 which electrically insulates the second metal layer 55 from the first conductive semiconductor layer 11. The contact part 75 may be formed through the first insulating layer 53. A plurality of contact parts 75 may be provided. The contact part 75 may include at least one selected from the group consisting of Cr, V, Pt, W, Ti, Zn, Ni, Cu, Al, Ag, and Au.

A first region of the contact part 75 may make contact with a top surface of the first conductive semiconductor layer 11. A second region of the contact part 75 may be disposed at lateral sides of the active layer 12 and the second conductive semiconductor layer 13. The second insulating layer 63 may be disposed between the second region of the contact part 75 and the active layer 12 and between the second region of the contact part 75 and the second conductive semiconductor layer 13.

The second insulating layer 63 may electrically insulate the contact part 75 from the active layer 12. The second insulating layer 63 may electrically insulate the contact part 75 from the second conductive semiconductor layer 13. One end of the second insulating layer 63 may be disposed on the first conductive semiconductor layer 11. The other end of the second insulating layer 63 may be disposed on the first insulating layer 53. A portion of the second insulating layer 63 may be disposed between the contact part and the first insulating layer 53. The first insulating layer 53 may include at least one of oxide and nitride.

The contact part 75 may be spaced apart from a lateral side of the first metal layer 50. For instance, the first metal layer 50, the first insulating layer 53 and the contact part 75 may have the structure as shown in FIG. 2. FIG. 2 is a sectional view taken along line A-A of the light-emitting device shown in FIG. 1.

A plurality of contact parts 75 may be provided. The contact part 75 may be surrounded by the first insulating layer 53. The contact part 75 may be electrically insulated from the first metal layer 50 by the first insulating layer 53.

Meanwhile, the light-emitting device according to the embodiment may include the electrode 80 which is electrically connected to the first metal layer 50 and spaced apart from the lateral side of the light-emitting structure 10. The electrode 80 spaced apart from the lateral side of the light-emitting structure 10 may make contact with the top surface of the first meal layer 50.

According to the embodiment, power may be applied to the light-emitting structure 10 through the reflective electrode 17 and the electrode 80. According to the embodiment, the electrode 80 may be realized in the form of a multiple layer. The electrode 80 may include an ohmic layer, an intermediate layer, and an upper layer. The ohmic layer may include a material selected from the group consisting of Cr, V, Pt, W, Ti, and Zn to realize ohmic contact. The intermediate layer may be realized by using a material selected from the group consisting of Ni, Cu, Al and Ag. For instance, the upper layer may include Au. The electrode 80 may include at least one selected from the group consisting of Cr, V, Pt, W, Ti, Zn, Ni, Cu, Al, Ag, and Au.

In the light-emitting device according to the embodiment, a power source having a first electric potential may be connected to the second conductive semiconductor layer 13 through the first metal layer 50 and the reflective electrode 17 and a power source having a second electric potential may be connected to the first conductive semiconductor layer 11 through the second metal layer 55 and the contact part 75. Thus, power may be applied to the light-emitting structure 10 so that the active layer 12 may emit light. According to the light-emitting device of the embodiment, the contact parts 75 may be connected to the first conductive semiconductor layer 11, so that the current spreading can be improved. As a result, the operating voltage can be lowered.

Figure 8:
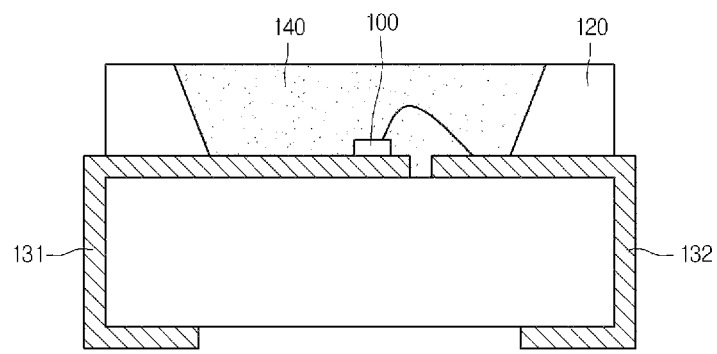
FIG. 8 is a view showing a light-emitting device package according to the embodiment.

FIG. 8 is a view showing a light-emitting device package to which the light-emitting device according to the embodiment is applied.

Referring to FIG. 8, the light-emitting device package according to the embodiment may include a body 120, first and second lead electrodes 131 and 132 formed on the body 120, a light-emitting device 100 provided on the body 120 and electrically connected to the first and second lead electrodes 131 and 132 and a molding member 140 that surrounds the light-emitting device 100.

The body 120 may include silicon, synthetic resin or metallic material, and an inclined surface may be formed in the vicinity of the light-emitting device 100.

The first and second lead electrodes 131 and 132 are electrically isolated from each other to supply power to the light-emitting device 100. The first and second lead electrode 131 and 132 can improve the light efficiency by reflecting the light emitted from the light-emitting device 100. Further, the first and second lead electrodes 131 and 132 may dissipate heat generated from the light-emitting device 100 to the outside.

The light-emitting device 100 can be installed on the body 120 or the first or second lead electrode 131 or 132.

The light-emitting device 100 may be electrically connected to the first and second lead electrodes 131 and 132 through one of a wire scheme, a flip-chip scheme, and a die-bonding scheme.

The molding member 140 may surround the light-emitting device 100 to protect the light-emitting device 100. In addition, the molding member 140 may include phosphors to change the wavelength of the light emitted from the light-emitting device 100.

A plurality of light-emitting device or light-emitting device packages according to the embodiment may be arrayed on a substrate, and an optical member including a lens, a light guide plate, a prism sheet, or a diffusion sheet may be provided on the optical path of the light emitted from the light-emitting device package. The light-emitting device package, the substrate, and the optical member may serve as a light unit. The light unit is realized in a top view type or a side view type and variously provided in display devices of a portable terminal and a laptop computer or a lighting apparatus and an indicator apparatus. In addition, a lighting apparatus according to another embodiment can include a light-emitting device, or a light-emitting device package according to the embodiment. For example, the lighting apparatus may include a lamp, a signal lamp, an electric sign board and a headlight of a vehicle.

The light-emitting device according to the embodiment may be applied to the light unit. The light unit has a structure in which a plurality of light-emitting devices are arrayed. The light unit may include a display device as shown in FIGS. 9 and 10 and the lighting apparatus as shown in FIGS. 11 to 15.

Figure 9:
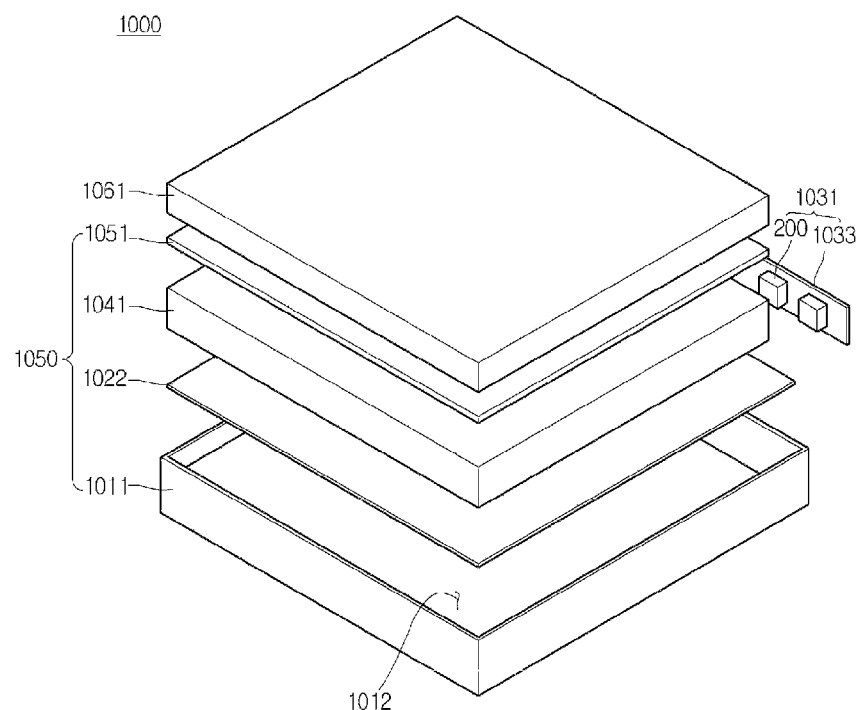
FIG. 9 is a view showing a display device according to the embodiment.
Figure 10:
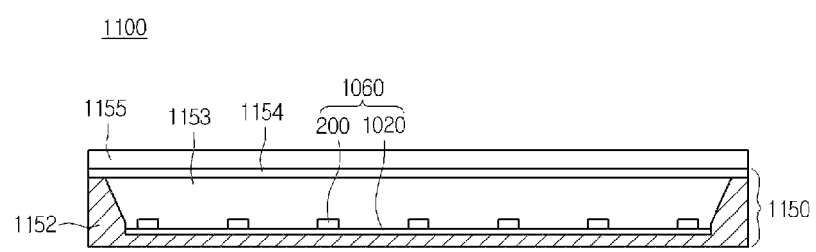
FIG. 10 is a view showing another example of the display device according to the embodiment.

Referring to FIG. 9, a display device 1000 according to the embodiment includes a light guide plate 1041, a light-emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light-emitting module 1031, and the reflective member 1022. However, the embodiment is not limited to the above structure.

The bottom cover 1011, the reflective member 1022, the light guide plate 1041 and the optical sheet 1051 may constitute a light unit 1050.

The light guide plate 1041 diffuses the light to provide surface light. The light guide plate 1041 may include transparent material. For example, the light guide plate 1041 may include one of acryl-based resin, such as PMMA (polymethyl methacrylate), PET (polyethylene terephthalate), PC (polycarbonate), COC (cyclic olefin copolymer) and PEN (polyethylene naphthalate) resin.

The light-emitting module 1031 supplies the light to at least one side of the light guide plate 1041. The light-emitting module 1031 serves as the light source of the display device.

At least one light-emitting module 1031 is provided to directly or indirectly supply the light from one side of the light guide plate 1041. The light-emitting module 1031 may include a substrate 1033 and light-emitting devices 100 or the light-emitting device package 200 according to the embodiment described above. The light-emitting packages 200 may be arrayed on the substrate 1033 while being spaced apart from each other at the predetermined interval.

The substrate 1033 may be a printed circuit board (PCB) including a circuit pattern. In addition, the substrate 1033 may also include a metal core PCB (MCPCB) or a flexible PCB (FPCB) as well as the PCB, but the embodiment is not limited thereto. If the light-emitting device packages 200 are installed on the lateral side of the bottom cover 1011 or on a heat dissipation plate, the substrate 1033 may be omitted. The heat dissipation plate may partially make contact with the top surface of the bottom cover 1011.

In addition, the light-emitting device packages 200 are installed such that light exit surfaces of the light-emitting device packages 200 are spaced apart from the light guide plate 1041 at a predetermined distance, but the embodiment is not limited thereto. The light-emitting device packages 200 may directly or indirectly supply the light to a light incident part, which is one side of the light guide plate 1041, but the embodiment is not limited thereto.

The reflective member 1022 may be disposed below the light guide plate 1041. The reflective member 1022 reflects the light, which travels downward through the bottom surface of the light guide plate 1041, upward, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light-emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by using light passing through the optical sheet 1051. The display device 1000 can be applied to various portable terminals, monitors of notebook computers and laptop computers, and televisions.

The optical sheet 1051 is disposed between the display panel 1061 and the light guide plate 1041 and includes at least one transmissive sheet. For example, the optical sheet 1051 includes at least one of a diffusion sheet, horizontal and vertical prism sheets, and a brightness enhanced sheet. The diffusion sheet diffuses the incident light, the horizontal and/or vertical prism sheet concentrates the incident light onto a display region, and the brightness enhanced sheet improves the brightness by reusing the light to be lost. In addition, a protective sheet can be provided on the display panel 1061, but the embodiment is not limited thereto.

The light guide plate 1041 and the optical sheet 1051 can be provided on the optical path of the light-emitting module 1031 as optical members, but the embodiment is not limited thereto.

FIG. 10 is a view showing another example of a display device according to the embodiment.

Referring to FIG. 10, the display device 1100 includes a bottom cover 1152, a substrate 1020 on which the light-emitting devices 100 are arrayed, an optical member 1154, and a display panel 1155.

The substrate 1020 and the light-emitting device packages 200 may constitute a light-emitting module 1060. The bottom cover 1152, at least one light-emitting module 1060, and the optical member 154 may constitute a light unit.

The bottom cover 1152 can be provided therein with a receiving section 1153, but the embodiment is not limited thereto.

In this case, the optical member 1154 may include at least one of a lens, a light guide plate, a diffusion sheet, horizontal and vertical prism sheets, and a brightness enhanced sheet. The light guide plate may include PC or PMMA (Poly methyl methacrylate). The light guide plate can be omitted. The diffusion sheet diffuses the incident light, the horizontal and vertical prism sheets concentrate the incident light onto a display region, and the brightness enhanced sheet improves the brightness by reusing the light to be lost.

The optical member 1154 is disposed above the light-emitting module 1060 in order to convert the light emitted from the light-emitting module 1060 into the surface light. In addition, the optical member 1154 may diffuse or collect the light.

Figure 11:
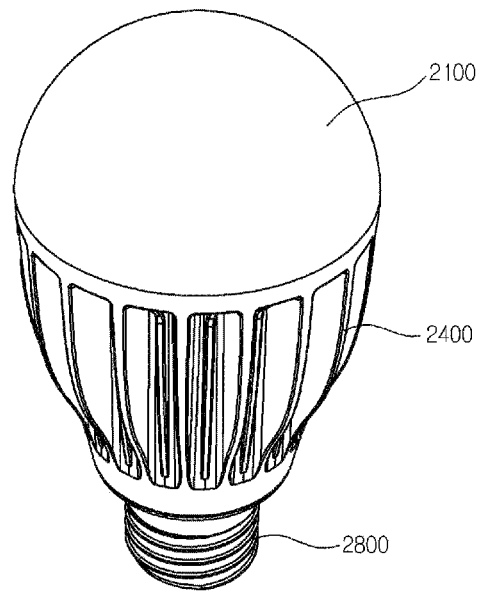
FIGS. 11 to 13 are views showing a lighting apparatus according to the embodiment.
Figure 12:
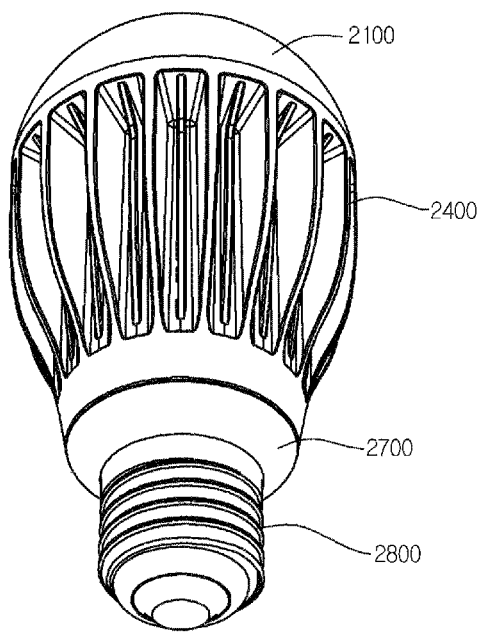
Figure 13:
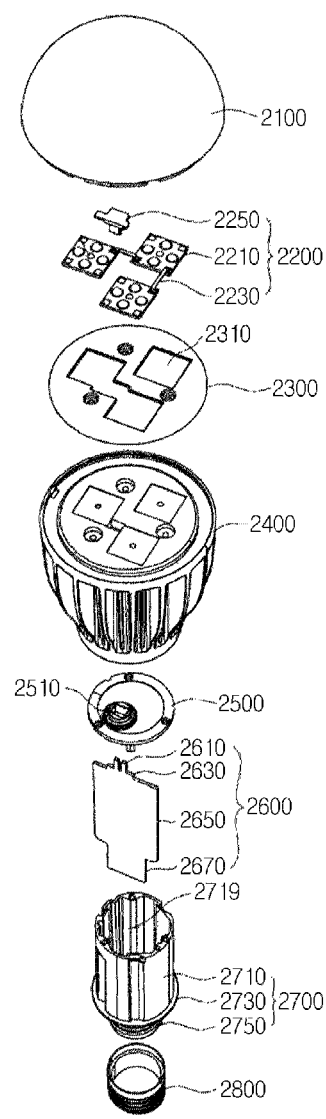

FIGS. 11 to 13 are views showing a lighting apparatus according to the embodiment.

FIG. 11 is a top perspective view of the lighting apparatus, FIG. 12 is a bottom perspective view of the lighting apparatus shown in FIG. 11, and FIG. 13 is an exploded perspective view of the lighting apparatus shown in FIG. 11.

Referring to FIGS. 11 to 13, the lighting apparatus according to the embodiment may include a cover 2100, a light source module 2200, a radiator 2400, a power supply part 2600, an inner case 2700, and a socket 2800. The lighting apparatus according to the embodiment may further include at least one of a member 2300 and a holder 2500. The light source module 2200 may include the light-emitting device package according to the embodiment.

For example, the cover 2100 may have a blub shape or a hemispheric shape. The cover 2100 may have a hollow structure which is partially open. The cover 2100 may be optically coupled with the light source module 2200. For example, the cover 2100 may diffuse, scatter, or excite light provided from the light source module 2200. The cover 2100 may be an optical member. The cover 2100 may be coupled with the radiator 2400. The cover 2100 may include a coupling part which is coupled with the radiator 2400.

The cover 2100 may include an inner surface coated with a milk-white pigment. The milk-white pigment may include a diffusion material to diffuse light. The roughness of the inner surface of the cover 2100 may be greater than the roughness of the outer surface of the cover 2100. The surface roughness is provided for the purpose of sufficiently scattering and diffusing the light from the light source module 2200.

The cover 2100 may include glass, plastic, polypropylene (PP), polyethylene (PE) or polycarbonate (PC). The polycarbonate (PC) has the superior light resistance, heat resistance and strength among the above materials. The cover 2100 may be transparent so that a user may view the light source module 2200 from the outside, or may be opaque. The cover 2100 may be formed through a blow molding scheme.

The light source module 220 may be disposed at one surface of the radiator 2400. Accordingly, the heat from the light source module 220 is transferred to the radiator 2400. The light source module 2200 may include a light source 2210, a connection plate 2230, and a connector 2250.

The member 2300 is disposed on a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white pigment. The member 2300 reflects again light, which is reflected by the inner surface of the cover 2100 and is returned to the direction of the light source module 2200, to the direction of the cover 2100. Accordingly, the light efficiency of the lighting apparatus according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be formed by an insulating material, thereby preventing the connection plate 2230 from being electrically shorted with the radiator 2400. The radiator 2400 receives heat from the light source module 2200 and the power supply part 2600 and dissipates the heat.

The holder 2500 covers a receiving groove 2719 of an insulating part 2710 of an inner case 2700. Accordingly, the power supply part 2600 received in the insulating part 2710 of the inner case 2700 is sealed. The holder 2500 includes a guide protrusion 2510. The guide protrusion 2510 has a hole and a protrusion of the power supply part 2600 extends by passing through the hole.

The power supply part 2600 processes or converts an electric signal received from the outside and provides the processed or converted electric signal to the light source module 2200. The power supply part 2600 is received in the receiving groove 2719 of the inner case 2700, and is sealed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed on one surface of the base 2650. For example, the components may include a DC converter to convert AC power provided from an external power supply into DC power, a driving chip to control the driving of the light source module 2200, and an electrostatic discharge (ESD)

protection device to protect the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

Figure 14:
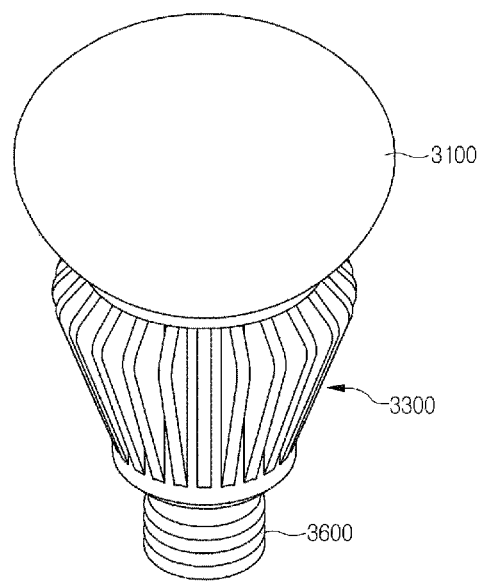
FIGS. 14 and 15 are views showing another example of a lighting apparatus according to the embodiment.
Figure 15:
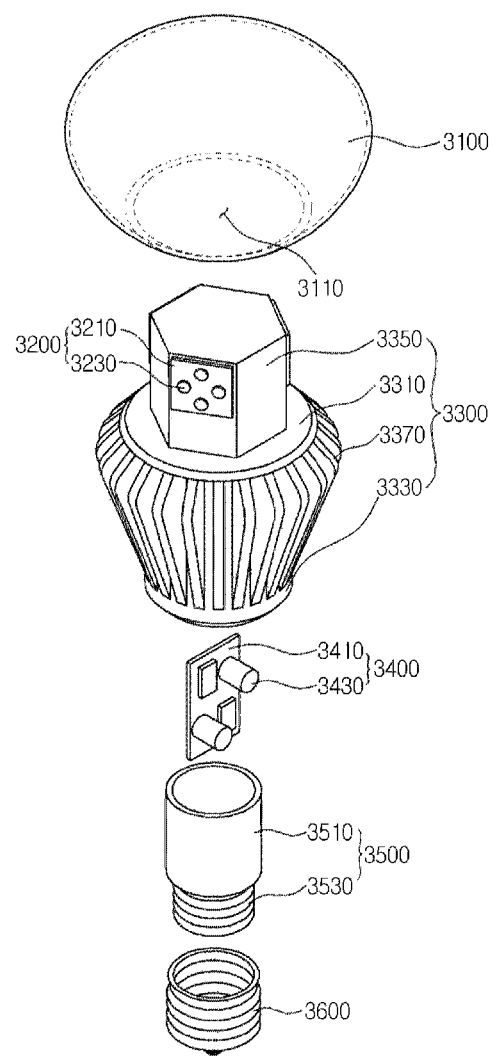

FIGS. 14 and 15 are views showing another example of a lighting apparatus according to the embodiment.

FIG. 14 is a perspective view of the lighting apparatus according to the embodiment and FIG. 15 is an exploded perspective view of the lighting apparatus shown in FIG. 14.

Referring to FIGS. 14 and 15, the lighting apparatus according to the embodiment may include a cover 3100, a light source part 3200, a radiator 3300, a circuit part 3400, an inner case 3500, and a socket 3600. The light source part 3200 may include the light-emitting device or the light-emitting device module according to the embodiment.

The cover 3100 may have a hollow blub shape. The cover 3100 has an opening 3110. The light source part 3200 and a member 3350 may be inserted through the opening 3110.

The cover 3100 may be coupled with the radiator 3300 and may surround the light source part 3200 and the member 3350. The light source part 3200 and the member 3350 may be blocked from the outside by the coupling between the cover 3100 and the radiator 3300. The cover 3100 may be coupled with the radiator 3300 by an adhesive or various schemes such as a rotation coupling scheme and a hook coupling scheme. The rotation coupling scheme is a scheme where a thread of the cover 3100 is coupled with a screw groove of the radiator 3300, and the cover 3100 is coupled with the radiator 3300 by rotation of the cover 3100. The hook coupling scheme is a scheme where a projection of the cover 3100 is inserted into a groove of the radiator 3300 so that the cover 3100 is coupled with the radiator 3300.

The cover 3100 may be optically coupled with the light source module 32200. For example, the cover 3100 may diffuse, scatter, or excite light provided from the light-emitting device 3230 of the light source part 3200. The cover 3100 may be a type of optical member. The cover 3100 may have a phosphor formed on inner/outer surfaces or an inside of the cover 3100 to excite the light from the light source part 3200.

The cover 3100 may include an inner surface coated with a milk-white paint. The milk-white paint may include a diffusion material to diffuse light. The cover 3100 may have the inner surface of which surface roughness is greater than that of the outer surface thereof. The surface roughness is provided for the purpose of sufficiently scattering and diffusing the light from the light source part 3200.

For example, a material of the cover 3100 may include glass, plastic, polypropylene (PP), polyethylene (PE), and polycarbonate (PC). The polycarbonate (PC) has the superior light resistance, heat resistance and strength among the above materials. The cover 3100 may be transparent so that a user may view the light source part 3200 and the member 3500 from the outside, or the cover 3100 may be opaque. The cover 3100 may be formed through a blow molding scheme.

The light source part 3200 is disposed at the member 3350 of the radiator 3300, and a plurality of light source parts 3200 may be provided. In detail, the light source part 3200 may be disposed on at least one of side surfaces of the member 3350. In addition, the light source part 3200 may be disposed at an upper portion of the side surface of the member 3350.

Referring to FIG. 15, the light source part 3200 may be disposed at three of six side surfaces of the member 3350. However, the embodiment is not limited thereto, and the light source part 3200 may be disposed at all side surfaces of the member 3350. The light source part 3200 may include a substrate 3210 and a light-emitting device 3230. The light-emitting device 3230 may be disposed on one surface of the substrate 3210.

The substrate 3210 has a rectangular plate shape, but the embodiment is not limited thereto. The substrate 3210 may have various shapes. For example, the substrate 3210 may have a circular plate shape or a polygonal plate shape. The substrate 3210 may be provided by printing a circuit pattern on an insulator. For example, the substrate 3210 may include a typical printed circuit board (PCB), a metal core PCB, a flexible PCB, and a ceramic PCB. In addition, the substrate may have a COB (chips on board) type in which LED chips, which are not packaged, are directly bonded on the PCB. In addition, the substrate 3210 may include a material suitable to reflect light, or the surface of the substrate may have a color such as a white color or a silver color to effectively reflect the light. The substrate 3210 may be electrically connected to the circuit part 3400 received in the radiator 3300. For example, the substrate 3210 and the circuit part 3400 may be connected to each other by a wire. The wire may connect the substrate 3210 and the circuit part 3400 to each other by passing through the radiator 3300.

The light-emitting device 3230 may be a light-emitting diode chip for emitting red, green, blue or UV light. The light-emitting diode chip may be a lateral type or a vertical type and the light-emitting diode chip may emit blue, red, yellow or green light.

The light-emitting device 3230 may include a luminescence material. The luminescence material may include at least one of garnet-based phosphors (YAG, or TAG), silicate-based phosphors, nitride-based phosphors, and oxynitride-based phosphors. The luminescence material may include at least one of a red luminescence material, a yellow luminescence material and a green luminescence material.

The radiator 3300 is coupled with the cover 3100, and may radiate heat from the light source part 3200. The radiator 330 has a predetermined volume, and includes a top surface 3310 and a side surface 3330. The member 3350 may be disposed on the top surface 3310 of the radiator 3310. The top surface 3310 of the radiator 3300 may be coupled with the cover 3100. The top surface 3310 of the radiator 3300 may have a shape corresponding to an opening 3110 of the cover 3100.

A plurality of heat radiation pins 3370 may be disposed at the side surface 3330 of the radiator 3300. The heat radiation pin 3370 may extend outward from the side surface 3330 of the radiator 3300 or may be connected to the side surface 3330 of the radiator 3300. The heat radiation pin 3370 may improve heat radiation efficiency by increasing a heat radiation area of the radiator 3300. The side surface 3330 may not include the heat radiation pin 3370.

The member 3350 may be disposed on the top surface of the radiator 3300. The member 3350 may be integrated with or coupled to the top surface 3310 of the radiator 3300. The member 3350 may have the shape of a polygonal prism. In detail, the member 3350 may have the shape of a hexahedral prism. The member 3350 having the shape of a hexahedral prism includes a top surface, a bottom surface, and six side surfaces. The member 3350 may have the shape of a circular prism or the shape of an elliptical prism as well as the shape of a hexahedral prism. When the member 3350 has the shape of a circular prism or the shape of an elliptical prism, the substrate 3210 of the light source part 3200 may be a flexible substrate.

The light source part 3200 may be disposed at six side surfaces of the member 3350. The light source part 3200 may be disposed at all or some of the six side surfaces of the member 3350. The light source part 3200 is disposed at three of the six side surfaces of the member 3350.

The substrate 3210 is disposed at the side surface of the member 3350. The side surface of the member 3350 may be substantially vertical to the top surface 3310 of the radiator 3300. Accordingly, the substrate 3210 and the top surface of the radiator 3300 may be substantially vertical to each other.

The member 3350 may include a material representing thermal conductivity. Thus, heat from the light source part 3200 can be rapidly transferred to the member 3350. For example, the material for the member 3350 may include an alloy of metals such as aluminum (Al), nickel (Ni), copper (Cu), magnesium (Mg), silver (Ag), or tin (Sn). In addition, the member 3350 may include a plastic material having thermal conductivity. The plastic material having thermal conductivity is advantageous in that it is lighter than the metal and has thermal conductivity in a single direction.

The circuit part 3400 receives power from the outside, and converts the received power suitably for the light source part 3200. The circuit part 3400 provides the converted power to the light source part 3200. The circuit part 3400 may be disposed at the radiator 3300. In detail, the circuit part 3400 may be received in the inner case 3500, and may be received in the radiator 3300 together with the inner case 3500. The circuit part 3400 may include a circuit board 3410 and a plurality of components mounted on the circuit board 3410.

The circuit board 3410 has a circular shape, but the embodiment is not limited thereto. That is, the circuit board 3410 may have various shapes. For example, the circuit board may have an elliptical shape or a polygonal shape. The circuit board 3410 may be provided by printing a circuit pattern on an insulator. The circuit board 3410 is electrically connected to the substrate 3210 of the light source part 3200. For example, the circuit part 3410 and the substrate 3210 may be connected to each other by a wire. The wire may be disposed inside the radiator 3300 to connect the substrate 3210 to the circuit board 3410. For example, a plurality of components 3430 may include a direct current converter converting AC power provided from an external power supply into DC power, a driving chip controlling driving of the light source part 3200, and an electrostatic discharge (ESD) protective device.

The inner case 3500 receives the circuit part 3400 therein. The inner case 3500 may include a receiving part 3510 to receive the circuit part 3400. For example, the receiving part 3510 may have a cylindrical shape. The shape of the receiving part 3510 may be changed according to the shape of the radiator 3300. The inner case 3500 may be received in the radiator 3300. The receiving part 3510 of the inner case 3500 may be received in a receiving part which is formed at a bottom surface of the radiator 3300.

The inner case 3500 may be coupled with the socket 3600. The inner case 3500 may include a connecting part 3530 coupled with the socket 3600. The connecting part 3530 may have a thread structure corresponding to a screw groove structure of the socket 3600. The inner case 3500 is an insulator. Accordingly, the inner case 3500 prevents electric short between the circuit part 3400 and the radiator 3300. For example, the inner case 3500 may include a plastic or resin material.

The socket 3600 may be coupled with the inner case 3500. In detail, the socket 3600 may be coupled with the connecting part 3530 of the inner case 3500. The socket 3600 may have the structure the same as that of a conventional incandescent light bulb. The socket 3600 is electrically connected to the circuit part 3400. For example, the circuit part 3400 and the socket 3600 may be connected to each other by a wire. If external power is applied to the socket 3600, the external power may be transferred to the circuit part 3400. The socket 3600 may have a screw groove structure corresponding to a thread structure of the connecting part 3550.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light-emitting device comprising:
   a light-emitting structure comprising a first conductive semiconductor layer, an active layer under the first conductive semiconductor layer, and a second conductive semiconductor layer under the active layer;
   a reflective electrode under the light-emitting structure;
   a first metal layer disposed under the reflective electrode and electrically connected to the second conductive semiconductor layer;
   a second metal layer disposed under the reflective electrode and insulated from the first metal layer;
   an electrode electrically connected to the first metal layer and spaced apart from a lateral side of the light-emitting structure; and
   a contact part electrically connecting the second metal layer to the first conductive semiconductor layer,
   wherein the first metal layer comprises a first region making contact with a bottom of the second conductive semiconductor layer and a second region extending outward from the first region, and wherein the electrode spaced apart from the lateral side of the light-emitting structure contacts a top surface of the first metal layer.

2. The light-emitting device of claim 1, wherein the first metal layer is electrically connected to the reflective layer.

3. The light-emitting device of claim 1, wherein the second metal layer is disposed under the first metal layer.

4. The light-emitting device of claim 1, further comprising a first insulating layer between the first metal layer and the second metal layer.

5. The light-emitting device of claim 4, wherein the contact part is formed through the first insulating layer.

6. The light-emitting device of claim 4, wherein the first insulating layer is disposed around the first metal layer.

7. The light-emitting device of claim 1, wherein a first region of the contact part makes contact with a top surface of the first conductive semiconductor layer.

8. The light-emitting device of claim 1, wherein a second region of the contact part is disposed at lateral sides of the active layer and the second conductive semiconductor layer.

9. The light-emitting device of claim 8, further comprising a second insulating layer disposed between the second region of the contact part and the active layer and between the second region of the contact part and the second conductive semiconductor layer.

10. The light-emitting device of claim 1, wherein the contact part is spaced apart from a lateral side of the first metal layer.

11. The light-emitting device of claim 1, further comprising an ohmic contact layer between the second conductive semiconductor layer and the reflective electrode.

12. The light-emitting device of claim 1, wherein a plurality of contact parts are provided.

13. A light-emitting device package comprising:
a body;
a light-emitting device of claim 1 on the body; and
first and second lead electrodes electrically connected to the light-emitting device.

14. A light unit comprising:
a substrate;
a light-emitting device of claim 1 on the substrate; and
an optical member serving as an optical path for light emitted from the light-emitting device.

15. The light-emitting device of claim 1, wherein the second region of the first metal layer extends horizontally from the first region.

16. The light-emitting device of claim 15, wherein the second region of the first metal layer is exposed to a lower outer peripheral portion of the light-emitting structure.

17. The light-emitting device of claim 9, wherein one end of the second insulating layer is disposed on a top surface of the first conductive semiconductor layer, and
wherein the other end of the second insulating layer is disposed on the first insulating layer.

18. The light-emitting device of claim 17, wherein a portion of the second insulating layer is disposed between the contact part and the first insulating layer.

19. The light-emitting device of claim 17, wherein one end of the contact part is disposed on the one end of the second insulating layer and on the top surface of the first conductive semiconductor layer.

* * * * *